United States Patent
Bock et al.

(10) Patent No.: US 6,549,799 B2
(45) Date of Patent: Apr. 15, 2003

(54) CONCURRENT MRI OF MULTIPLE OBJECTS

(75) Inventors: Nicholas A. Bock, London (CA); R. Mark Henkelman, Toronto (CA)

(73) Assignee: Sunnybrook and Women's College Health Sciences Centre, Toronto (CA)

(*) Notice: Subject to any disclaimer, the term of this patent is extended or adjusted under 35 U.S.C. 154(b) by 167 days.

(21) Appl. No.: 09/837,913

(22) Filed: Apr. 18, 2001

(65) Prior Publication Data

US 2002/0156362 A1 Oct. 24, 2002

(51) Int. Cl.$^7$ .............................. A61B 8/00; G01V 3/00
(52) U.S. Cl. ...................... 600/422; 600/410; 600/411; 324/307; 324/309
(58) Field of Search ................................ 600/422, 410, 600/411, 439, 440, 441, 443; 324/307, 309, 310, 312, 314, 300

(56) References Cited

U.S. PATENT DOCUMENTS

| | | | |
|---|---|---|---|
| 4,318,043 A | | 3/1982 | Crooks et al. |
| 4,654,592 A | | 3/1987 | Zens |
| 4,810,968 A | | 3/1989 | Van Heelsbergen |
| 4,857,846 A | | 8/1989 | Carlson |
| 4,862,087 A | | 8/1989 | Hillenbrand et al. |
| 4,949,043 A | | 8/1990 | Hillenbrand et al. |
| 5,278,505 A | | 1/1994 | Arakawa |
| 5,420,510 A | * | 5/1995 | Fairbanks et al. .......... 324/309 |
| 5,680,047 A | * | 10/1997 | Srinivasan et al. ......... 600/422 |
| 5,910,728 A | | 6/1999 | Sodickson |
| 6,177,795 B1 | * | 1/2001 | Zhu et al. ................... 324/307 |
| 6,280,402 B1 | * | 8/2001 | Ishibashi et al. ............ 600/439 |
| 2002/0026224 A1 | * | 2/2002 | Thompson et al. .......... 607/60 |

OTHER PUBLICATIONS

Article by Fisher, et al., entitled "NMR Probe for the Simultaneous Acquisition of Multiple Samples" published in Journal of Magnetic Resonance, vol. 138, pp. 160–163 (1999).

Article by MacNamara, et al., entitled "Multiplex Sample NMR: An Approach To High–Throughput NMR Using a Parallel Coil Probe" published in Analytica Chimica Acta, vol. 397, pp. 9–16 (1999).

Article by Crooks, et al., entitled "Magnetic Resonance Imaging Strategies for Heart Studies" published in Radiology, vol. 153, pp. 459–465 (1984).

Article by Mellor, et al., entitled "Active Coil Isolation in NMR Imaging and Spectroscopy Using PIN Diodes and Tuned Transmission Line: A Pratical Approach" published in Magma, vol. 3, pp. 35–40 (1995).

Article by Li, et al., entitled "Multiple Solenoidal Microcoil Probes for High–Sensitivity, High–Throughput Nuclear Resonance Spectroscopy" published in Anal. Chem., vol. 71, pp. 4815–4820 (1999).

(List continued on next page.)

Primary Examiner—Hieu T. Vo
(74) Attorney, Agent, or Firm—Edward H. Berkowitz

(57) ABSTRACT

A plurality of objects are concurrently studied in a common MRI apparatus wherein the RF excitation is distributed to one plurality of K RF coils of N said pluralities of RF coils and one of each of said N is switched to a corresponding one of K RF receivers. The interaction of the several coils is further minimized by selectably detuning each coil except for an active coil(s).

18 Claims, 8 Drawing Sheets

OTHER PUBLICATIONS

Article by Ladd, et al., entitled "Reduction of Resonant RF Heating in Intravascular Catheters Using Coaxial Chokes" published in Magnetic Resonance in Medicine, vol. 43, pp. 615–619 (2000).

Article by Shen, et al., entitled "Dual–Frequency, Dual–Quadrature, Birdcage RF Coil Design with Identical B1 Pattern for Sodium and Proton Imaging of the Human Brain at 1.5 T" published in MRM, vol. 38, pp. 717–725 (1997).

Article by Pruessmann, et al., entitled "Sense: Sensitivity Encoding for Fast MRI" published in Magnetic Resonance in Medicine, vol. 42, pp. 952–962 (1999).

Article by Barberi, et al., entitled "A Transmit–Only /Receive–Only (TORO) RF Systems for High–Field MRI/MRS Applications" published in Magnetic Resonance in Medicine, vol. 43, pp. 284–289 (2000).

* cited by examiner

CONCURRENT MRI OF MULTIPLE OBJECTS

FIELD OF THE INVENTION

The invention is in the field of magnetic resonance imaging apparatus and methods and relates more particularly to the simultaneous imaging of a plurality of objects within a common magnet.

BACKGROUND OF THE INVENTION

For the past twenty years, magnetic resonance phenomena has been employed to obtain noninvasive imaging of the interior of a body. Much of this effort has been directed to medical investigation of humans and of animals, in the form of structural investigations as well as spatially selective chemical shift studies. Spatial resolution can be extremely high (microscopic imaging at the cellular level is achievable). MRI is an attractive imaging method for medical purposes because it is unparalleled for imaging soft tissue and pathology. Other applications include the non-destructive investigation of geologic cores, eggs and the like.

Practical methods for these investigations require a complex sequence of excitation and encoding of spatial information in RF phase dependence. Image data is necessarily voluminous and the acquisition of such numerous data consumes a concomitant time interval. This limits the productivity, or throughput of a facility when screening of multiple samples is necessary. The time interval per object may be shortened with the sacrifice of spatial resolution and/or tolerance of greater noise in the data. Utilization of an MRI facility for concurrent examination of multiple objects would advance screening and commercial applications suited to study objects appropriate to the dimensions of the imaging volume of such apparatus.

A system employing multiple RF coils for acquiring signals from the same tissue is disclosed in U.S. Pat. No. 4,857,846 to Carlson. The plural coils are there coaxially disposed and comprise the signal sources for respective plural RF receiver channels. A reconstruction algorithm is employed to operate upon the simultaneously acquired signals (having respective phase dependence corresponding to spatial relationship of the coils to the object/patient) to produce an image of the interior of the object/patient. In this arrangement, for example, after excitation, a first receiving coil provides slice selected and y-phase encoded data while the second receiving coil provides slice selected and x-phase encoded data. The total time for acquiring an image can thus be reduced by about one half.

Efforts directed to obtaining chemical shift spectral data simultaneously from multiple samples is described by Fisher, et al, in J. Mag. Res., v. 138, pp160–163 (1999). A multi-sample probe is there disclosed comprising two RF coils, each coupled to respective samples and also coupled to respective receivers. This work suggests expanded capacity through completely parallel channels, including a receiver for each RF coil. Use of a single receiver through a multiplex arrangement with frequency encoding from gradient pulses is also described. The provision of multiple receivers on a one-to-one basis for each RF coil becomes expensive as the number of RF coils increases.

Concurrent chemical analysis of separate samples is also disclosed in U.S. Pat. No. 4,654,592 to Zens.

The acquisition of NMR data from multiple objects using a single receiver and multiple acquisitions with and without applied gradients is suggested by MacNamara, et al, Analytica Chemica Acta, v.397,pp.9–16 (1999). These techniques appear particular to chemical analysis and without applicablity to simultaneous imaging of multiple objects.

Instrumentation has been disclosed for the purpose of mapping a magnetic field incident to compensating undesired gradients therein. For this usage, a plurality of discrete samples are disposed at respective locii. These plural samples are represented as being coupled to respective receiver channels. However, details of this arrangement are not elaborated. See U.S. Pat. Nos. 4,949,043; 4,862,087.

The concurrent imaging of a number of separate objects is desirable for enhancement of throughput. The necessity of separate RF excitation apparatus in close proximity presents the occurrence of crosstalk and various artifact invited by undesired coupling of the separate units, or RF cells. Crosstalk between separate transmit and receive coils has been addressed in the practice of medical MRI apparatus. In that context it is often the case that a large body coil provides RF excitation to the body under study while smaller receive coils are deployed in one or more regions of interest. Both the transmit coil and receive coil(s) couple strongly to the body under study with the consequence that there is commonly found to be significant coupling between the transmit and receive coils. It is known to address this problem by providing for the detuning of one of these coils when the other such coil is active. Representative references are U.S. Pat. Nos. 4,810,968; 5,278,505; Mellor and Checkley, MAGMA, v. 3, pp. 35–40 (1995).

In the practice of medical MRI, it is also known to efficiently acquire multiple images of respective slices of the body under study by interleaving certain process steps of the resonant preparation and readout of the signals from respective slices. See: U.S. Pat. No. 4,318,043; Crooks L.E., Radiology, v. 153, pp. 459–65 (1984).

The present work is directed to the acquisition of images of multiple objects, and particularly objects of irregular shape, e.g., mice. This presents a challenge in both the equipment and the time required for the acquisition of the several images. The specific application requires the anatomical survey of large numbers of transgenic mice with mutated genes in order to study their morphologies. A typical screening might require the examination of 5000 mice per year and the images should exhibit spatial resolution of 50 $\mu$m in each spatial coordinate. Using a fast spin echo pulse sequence for imaging, a data matrix of 700×700× 2000 would need to be acquired. Limiting the highest frequencies of a k space arrangement would serve to reduce the number of data points to $\pi(700/2)^2 *$ 2000. Estimated time for a single such image acquisition is about 3 hours. Operation of the equipment on a continuous basis might require 625 days for the examination of 5000 mice. A need is therefore presented for the efficient, precise and simultaneous acquisition of nominally similar objects.

SUMMARY OF THE PRESENT INVENTION

In a preferred embodiment of the present invention, the polarizing magnet, DC shims and pulsed gradient system of a magnetic resonance imaging (MRI) apparatus create a common magnetic environment for an array of plural RF coils with associated transmit/receive (TIR) switches, shields, and the like, arranged in sub-arrays. Each element of the array comprises a coil for independent imaging of the associated object. Grouping of N coils to form a sub-array allows for a manageable sharing of the modulated RF power for concurrent excitation of the N elements (N>1) of that sub-array. The several (e.g., K>1) sub-arrays are separately selected for excitation. For concurrent processing of the resonant signals from each object there are required N receiver channels which are selectively switched among the corresponding RF coils of each sub-array. The pulse sequence executed for acquiring the images is applied concurrently to the N RF coils of a subgroup and the sequence is interleaved among the subgroups. In the most straightforward description, each subgroup represents a common planar region of excitation for each of the N objects. Frequency encoding and phase encoding gradient pulses, in the well known art of magnetic resonance imaging, provide a parameter representing the density of resonant nuclei in the selected plane, or volume of the macro-object under study, e.g., the N objects. While N of the N×K objects are imaged with a literal or absolute simultaneity in a specific portion of k-space, the several (K) sub-arrays are cyclically subject to the same partial image acquisition. Thus the entire k-space for each of the N×K objects is acquired with substantial concurrency. The isolation of the several RF coils is improved by addressing the K×N−N coils in such a manner as to detune those RF coils which are instantaneously inactive. In the example described below, a floating conductor forming an (open) inductive loop is disposed the associated RF coil. This detuning loop is normally open, supporting no circulating RF current. A diode is disposed to close the loop when the diode is activated, thereby producing a coupled inductance to shift the resonant parameters of the RF coil. Thus the coupling to the RF coil shifts the resonant frequency away from the resonant frequency of the proximate active coil. Still further post-acquisition processing may be applied to remove artifacts from the several images.

BRIEF DESCRIPTION OF THE DRAWINGS

FIG. 2b is a timing diagram for the array of FIG. 2a.

While the invention is susceptible to various modifications and alternative forms, the above figures are presented by way of example and/or for assistance to understanding the structure or phenomena. It should be understood, however, that the description herein of the specific embodiments is not intended to limit the invention to the particular forms disclosed, but rather, the intention is to cover all modifications, equivalents, and alternatives falling within the spirit and scope of the invention as defined in the appended claims.

DETAILED DESCRIPTION OF THE INVENTION

Figure 1:
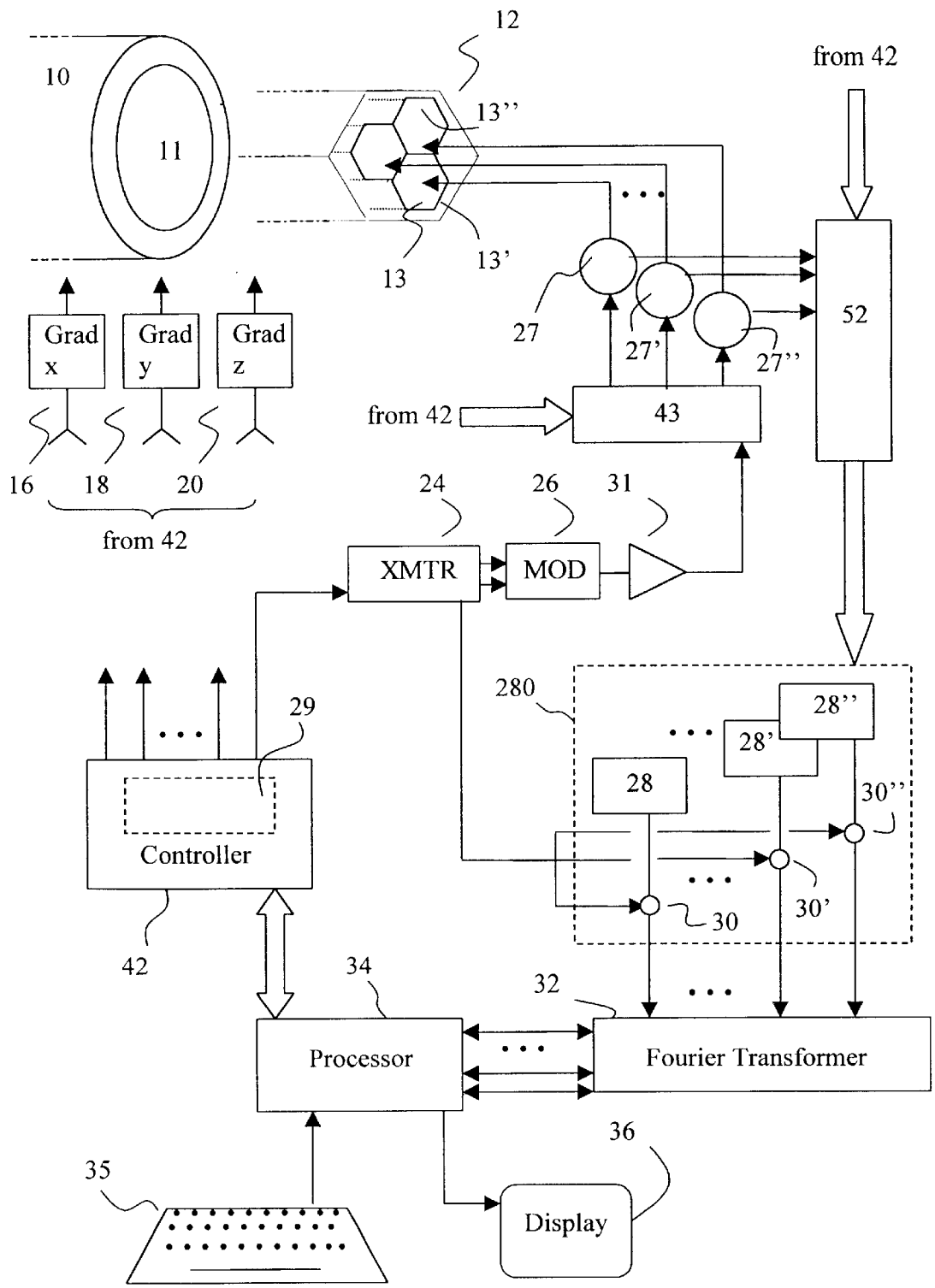
FIG. 1 shows the context of the invention.

The context of the invention is illustrated in the idealized general NMR system of FIG. 1. The physical context of the invention is an NMR apparatus. A magnet 10 having bore 11 provides a main magnetic field. In order to control the magnetic field with precision in time and direction, there are provided magnetic field gradient coils (not shown). These are driven by gradient power supplies 16, 18 and 20, respectively. Additionally, other shimming coils (not shown) and power supplies (not shown) may be required for compensating residual undesired spatial inhomogeneities in the basic magnetic field generated by magnet 10. Objects for analysis or imaging (hereafter "sample") are placed within the magnetic field in bore 11 and these samples are subject to irradiation by rf power, such that the rf magnetic field is aligned in a desired orthogonal relationship with the magnetic field in the interior of bore 11. The samples are disposed within respective coils of an array 12 of transmitter coils 13, . . . 13', 13" in the interior of bore 11. Resonant signals are induced in respective receiver coils, each surrounding the corresponding sample within bore 11. These transmitter and receiver coils typically form the identical structure for a given sample.

As shown in FIG. 1, RF power is provided from transmitter 24, and is amplified by an amplifier 31 and then directed to RF power director apparatus via T/R isolator 27 ( . . . 27', 27") to respective RF transmitter coils (collectively labeled 12) located within the bore 11. The transmitter 24 may be modulated in amplitude or frequency or phase or combinations thereof, either upon generation or by a modulator 26. Additional independent transmitter/modulator components are often employed to independently excite different gyromagnetic resonators, e.g., protons and C13. These independent excitations are conveniently supported by a multiply resonant coil as is well known. While transmit and receive functions are not concurrently active, the identical coil may be employed for both functions if so desired. Thus, the T/R isolator 27 (etc.) provides isolation between the receiver and the transmitter. In the case of separate transmitter and receiver coils, element 27 will perform a similar isolation function to control receiver operation. Block 43 represents RF power switching and distribution functions discussed below.

The modulator 26 is controlled by pulse programmer 29 within controller 42 to provide RF pulses of desired amplitude, duration and phase relative to the rf carrier at preselected time intervals. The pulse programmer may have hardware and/or software attributes. The pulse programmer also controls the gradient power supplies 16, 18 and 20, where such gradients arc required. These gradient power supplies excite magnetic field gradients of selectable magnitude and duration within the sensitive volume.

The transient nuclear resonance waveform are processed through coil selector 52 by receiver group 280 and further resolved in phase quadrature through corresponding phase detectors 30 ( . . . 30', 30"). The phase resolved time domain signals from phase detectors 30 ( . . . 30', 30"). are presented to Fourier transformer 32 for transformation to the frequency domain in accordance with specific requirements of the processing. Conversion of the analog resonance signal to digital form is commonly carried out on the phase resolved signals through analog to digital converter (ADC) structures which may be regarded as components of receiver group 280 for convenience.

It is understood that Fourier transformer 32 (which may be realized within, or under control of processor 34) may function in real time on a single waveform, or alternatively, act upon stored (in storage associated with processor 34) representations of the phase resolved data. This reflects the common practice of averaging a number of time domain phase resolved waveforms to enhance the signal-to-noise ratio. The transformation function is then applied to the resultant averaged waveform. Display device 36 operates on the acquired data to present same for inspection. Controller 42, most often comprising one or more computers, controls and correlates the time critical operation of the magnetic resonance phenomena, whereas processor 34 operates upon acquired signal data and accepts direction from a user through input device 35.

Figure 2A:
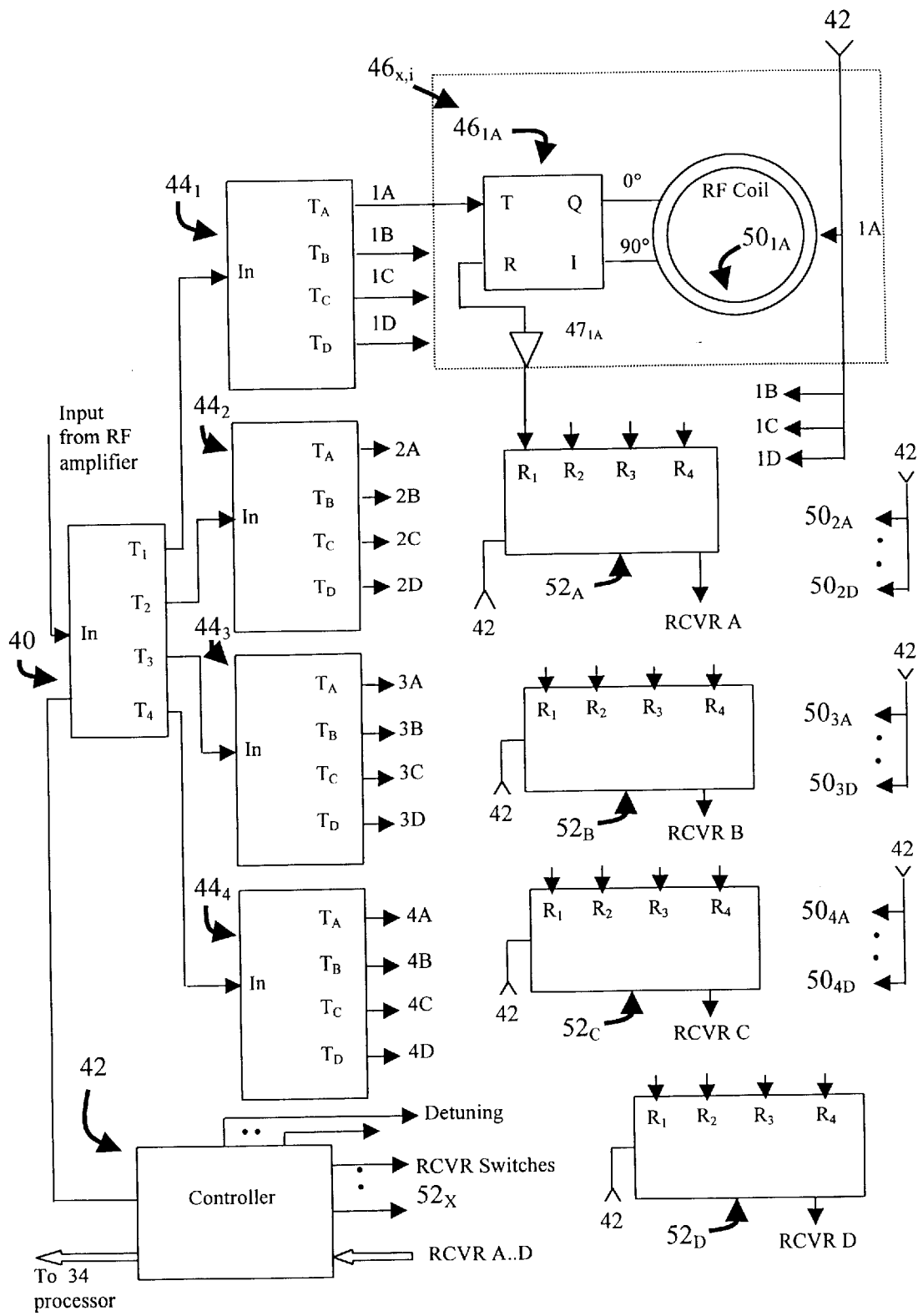
FIG. 2a shows an example organization of an N×K array of RF cells for multi object imaging.

Turning now to FIG. 2a, there is shown an N×K (here 4×4) organization for an array of N·K RF cells for practice of the invention. Consider first the arrangement for concurrent excitation of each of the N RF cells of one of the K groups. The N cells of the currently selected group are excited in common through the N outputs (here N=4) of the 1:N power splitter 44. The specific power splitter $44_x$ (x=1,2,3,4 in the example) is selected to derive full RF power from the actuation of high power RF switch 40 by controller 42. In the illustrated example ¼ of the available RF power is delivered to each quadrature-hybrid ($46_{1A}$ for example) of the corresponding RF cell $48_{1A}$. In this manner, each of the RF coils $50_{1X}$ (x=1,2,3,4) are excited.

Figure 3:
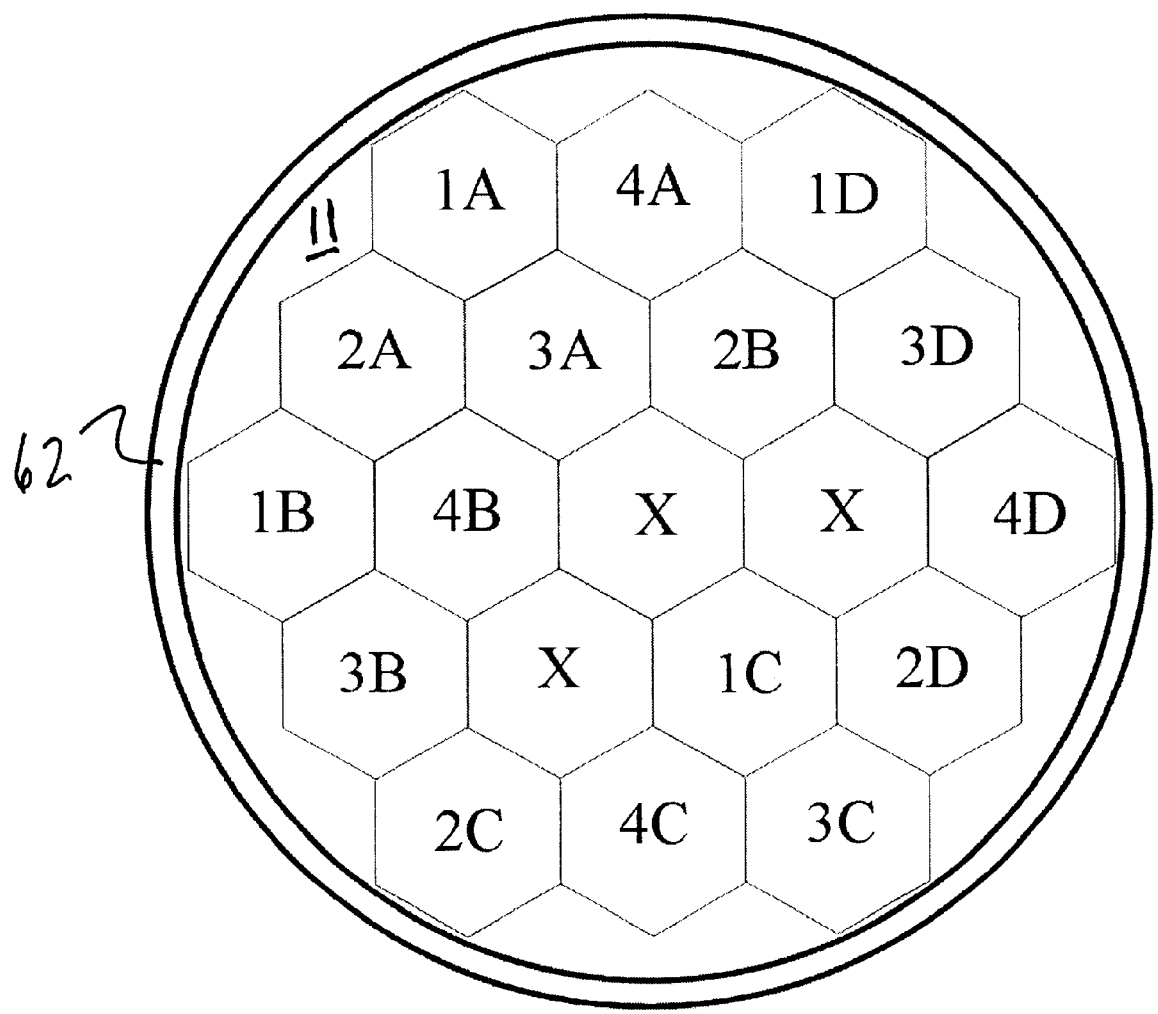
FIG. 3 illustrates the packing of 19 RF coils in a magnet bore with gradient orientations.

FIG. 3 represents the physical arrangement of the array of RF cells for the selective excitation/signal reception scheme of FIG. 2a. The preferred close-packed hexagonal disposition is dimensioned to fit within the available bore space of a conventional MRI apparatus. The objects to be concurrently studied (for example, a number of possibly mutated mice) are aligned along the axis of the bore of the magnet 10. The magnetic field gradient orientations include phase encoding gradients transverse to the bore of the magnet (direction of the DC polarizing field) and the readout gradient is aligned along the polarizing field. In this manner, the active RF cells concurrently excite corresponding longitudinal slabs of the respective objects.

The excitation process may require a complex set of steps, e.g., a portion of a pulse sequence, for the preparation of the nuclear spins of the object under study, which is discussed further below. At the completion of the excitation portion of the sequence and other intervening steps of the sequence, the independent and concurrent acquisition of resonant signals from individual objects are coupled to the RF coils of the respective RF cells of the Kth group of cells. For this purpose, each of N receivers (not shown) are connected to the respective RF coil through the preamplifier and quad-hybrid of that RF cell. After acquisition of the waveforms of the selected group, the receivers are connected to respective RF cells of the next group of RF cells through receiver switch $52_x$ (here x=A,B,C,D) among the corresponding RF cells $48_{x,i}$ to the respective receivers, where the receiver switch $52_x$ receives a 2 bit logic code (for the 4×4 example shown) and is switched in accord therewith by controller 42. The structure of receiver switch 52 is within the art. For example, switching of multiple coils to a receiver input is described by Li, et al, Anal. Chem., 1999, 71, pp.4815–4820. One example of a commercially available single pole-4 throw component is HMC182514 from Hittite Microwave Corporation, Chelmsford, Mass. Four such components suffice for the example 4×4 array to switch inputs of 4 receivers among the preamplifiers of the arrayed cells.

Figure 2B:
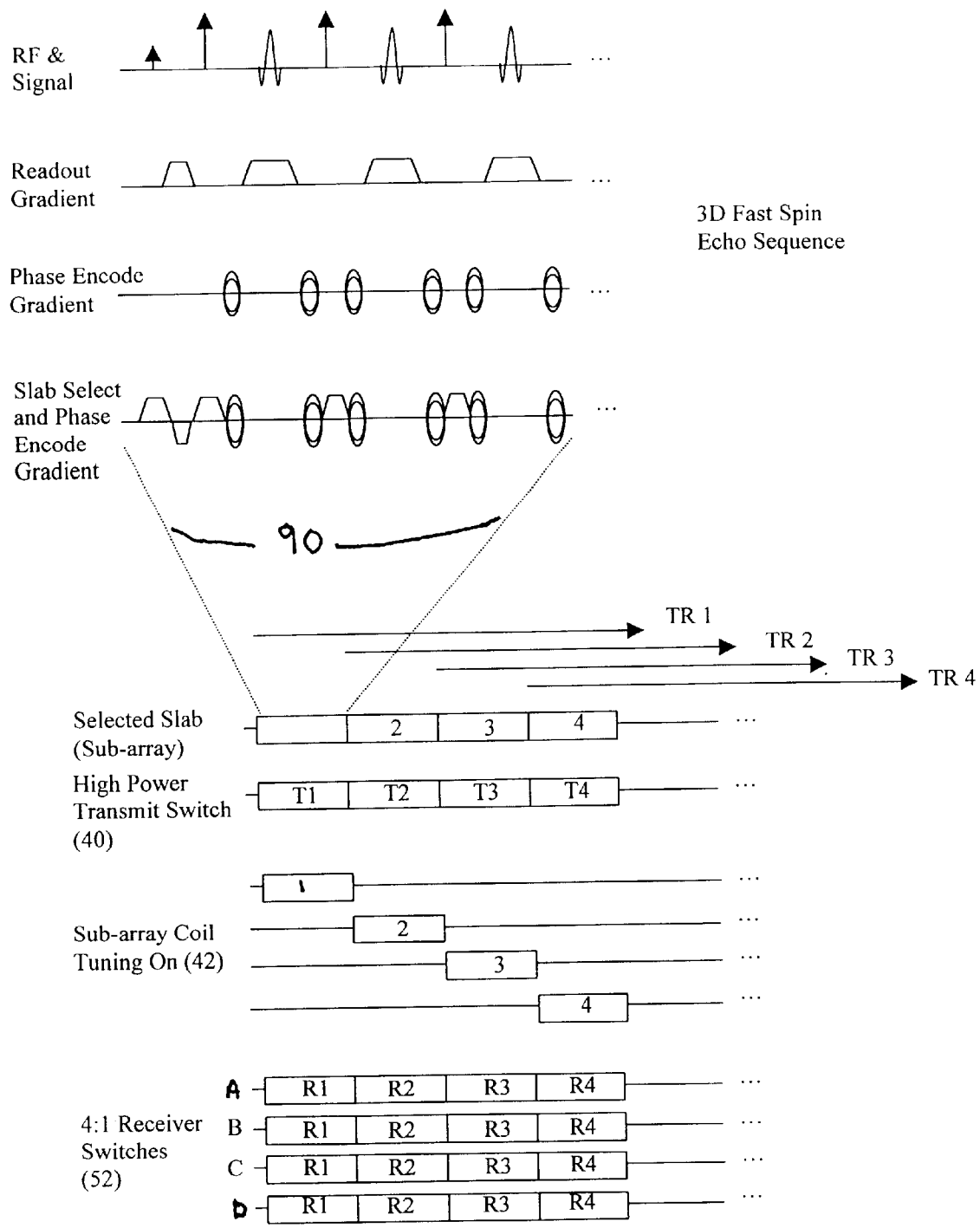

A summary of this activity is schematically illustrated in FIG. 2b wherein the horizontal direction represents a time continuum (except for the receiver switch array 520.) In particular, the high power transmit switch 40 is activated to sequentially provide RF power to each of the (4) groups during the respective intervals T1 . . . , T4. During the time that TX is active, the other RF coil groups are inactive and decoupling of these other coil groups is preferably furthered by activating the detuning feature 40 (described elsewhere herein). During the time interval when the selected group of RF coils is active, a selected pulse sequence is performed to acquire a portion of the desired image of each of the objects disposed in the respective coils. A portion of a representative sequence (here, a 3D fast spin-echo sequence) is shown. For the specific 4×4 example, the four receivers are switched to the preamplifiers (such as $47_{1A}$) of respective coils of the active group to obtain the free induction decay (FID) signals from the respective RF coils of the active group. The particular pulse sequence to be employed is not critical to the present invention and may depend upon the specific application and/or object to be studied. One specific pulse sequence 90 is shown merely to provide an example. The quantity of data to be acquired during a given active period is usually a subset of the entire k space, after which a different group of RF coils is selected through the high power transmit switch 40, the detuning feature appropriately activated to detune the non-selected coils, and the receivers switched to derive their inputs from the preamplifier of the selected group. Partially overlapping arrows TR1, . . . TR4 are intended to symbolically indicate the interleaving of portions of the repetition times for a pulse sequence from different sub-arrays.

It is important to recognize that the well-known procedure of interleaving data acquisition in MRI follows from the time intervals prevalent within pulse sequences. As mentioned above a general pulse sequence for magnetic resonance studies (including MRI) will comprise an excitation portion and an "acquire" portion during which the free induction decay signal is observed and recorded. Other steps, including the mere elapse of time or intervals between successive sequences, or periods intermediate the excitation and acquire portions occur in respect of a general pulse sequence. In so far as activity from a first cell or group of cells will not affect a second cell or group of cells, such activity may be initiated in the one group while the other group is inactive. Pulse sequences are characterized by a repetition time, TR and pulse sequences that incorporate an echo exhibit an echo time, TE. The value of TR, the ratios of these times (if applicable), the degree of coupling between the objects (small in the present work for relatively distantly displaced cells), the specific pulse sequence and the like contribute to the interleaving which is employed between groups of RF cells.

Receiver switch logic 520 operates to select the RF source for each receiver in accord with a logic signal derived from controller 42. All (here, 4) receivers are substantially continuously active, except that the signal source for corresponding receivers is switched to that sub-array of RF cells which is then active for acquisition of free induction decays from the respective RF coils. The receiver group symbolized by receiver switching logic 520 shown in FIG. 2b is not to be interpreted as having time dependence identifiable with the implicit time axis of FIG. 2b. Thus the system cycles through the groups of RF coils and through the regions of k space to obtain the desired images of the entire set of objects.

Figure 4:
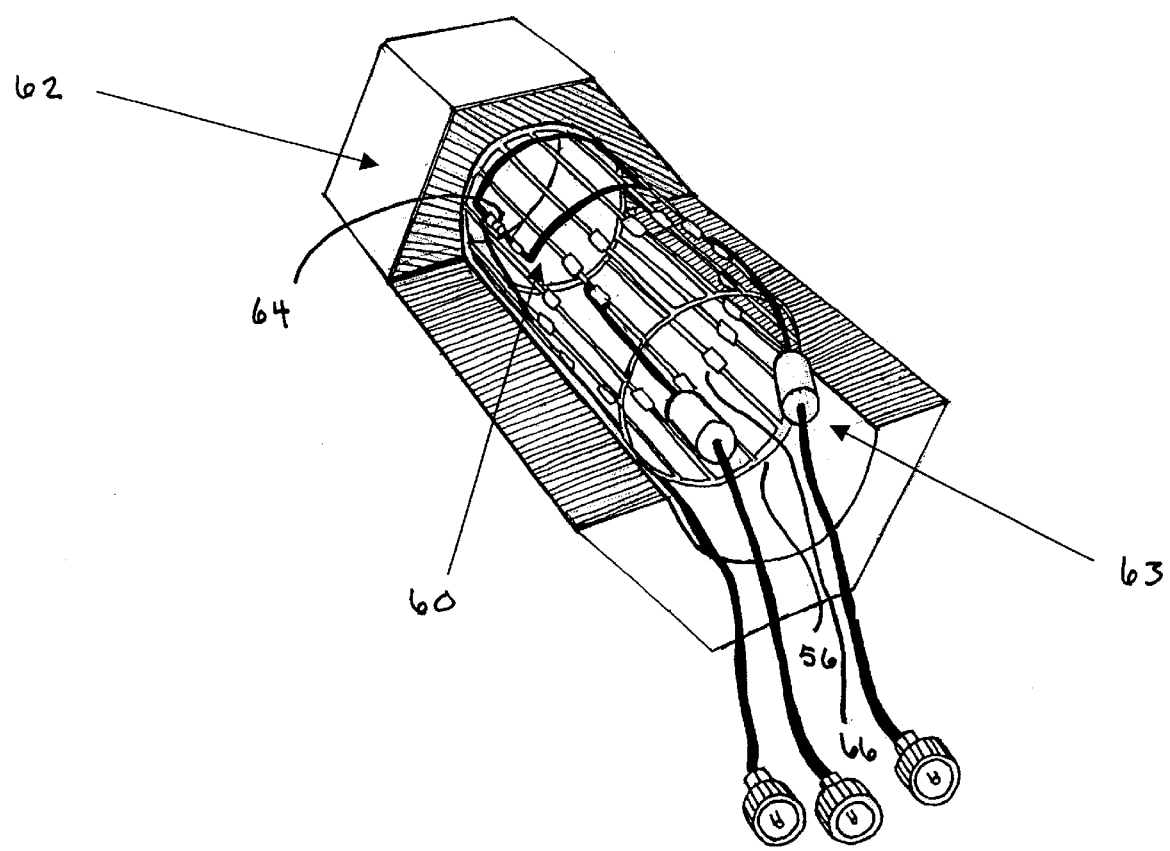
FIG. 4 shows one RF coil of the array of FIG. 3.

The RF cell $48_{x,i}$ may be regarded as comprising the quadrature-hybrid $46_{x,i}$ the RF coil 50, the preamplifier 54 and a supporting structure. The preamplifier and quadrature-hybrid are conventional and well known in the art. Turning now to FIG. 4, the RF coil 50 (subscripts are deleted here for brevity) is preferably a quadrature birdcage coil 56 of known construction and well known in the art. The quadrature-hybrid has the property of providing quadrature resolved components of the RF power input. Birdcage coils are frequently excited in quadrature by coupling such quadrature components to respective ports of the birdcage coil in well-known fashion. Specifically shown is an example comprising 16 rungs 65, each including chip capacitor 66. The aggregation of multiple RF coils in close proximity presents the problem of unintended coupling of such coils. The coil 56 is mounted within support 62 of acrylic, shown cut away for clarity. The supports 62 for respective RF coils nest within a honeycomb structure for insertion within bore 11. A shield (not shown) around the exterior of each coil support 62 attenuates the RF inductive coupling between otherwise independent coils. The shield geometry has effect on the resonant parameters of the coil, which is taken into account in tuning and matching of the RF cell as a unit. A detuning loop 60 is spaced apart from birdcage coil 56 intermediate the coil and the above-mentioned shield. This loop is electrically closed when PIN diode 64 is activated by the appropriate DC voltage and affords a closed loop for circulating currents. Cable shield traps 63 are typical matching devices for removing the effects of parasitic RF currents on the outer shield of coaxial conductors. See for example Ladd, et al, Mag. Res. In Med. 43:615–619 (2000); Shen, et al, Mag. Res. In Med. 38:717–725 (1997).

Figure 5:
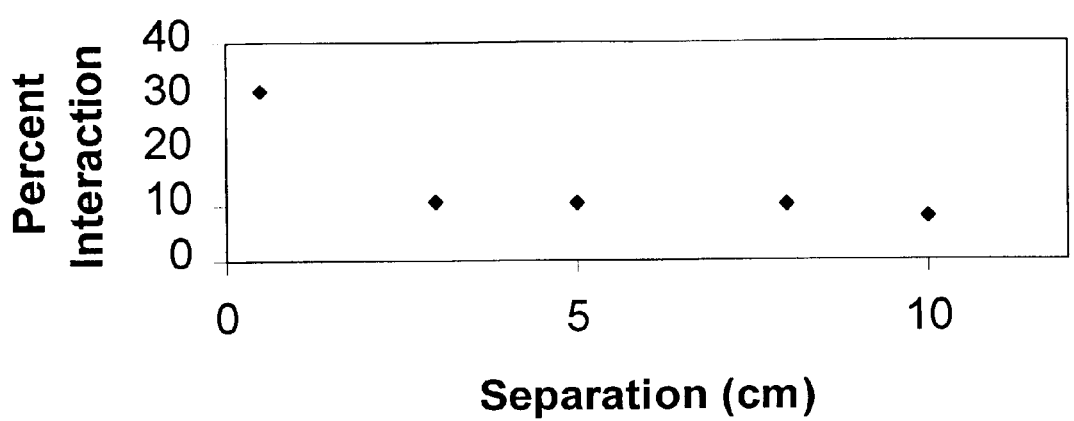
FIG. 5 shows a quantitative measure for coupling between two shielded RF coils.

The critical problem of crosstalk between proximate RF coils invites quantitative investigation. To this end the interaction of a pair of birdcage coils was studied at 1.5 Tesla. The coils were of standard birdcage geometry, each having 16 rungs distributed over a 3 cm diameter by 10 cm long cylindrical form housed in a cylindrical grounded shield of 40 μm wall-thickness copper measuring 5 cm by 20 cm in length. For these experimental measurements, each coil resonates at 63.85 MHz and presents 50 Ω to its source. A water phantom (2.5 g/l NaCl, 0.2 m M Mn Cl) of 45 ml in a 2.8 cm. diameter sample tube was placed on the axis of each coil and the coils aligned parallel with the polarizing field of the scanner with shields spaced by an axial separation which was varied from 0.5 cm to 10 cm. For each separation, an axial spin echo sequence was used to acquire the mean of the imaging signal. That is, the imaging signal was measured as the mean pixel value of a Region of Interest (ROI) that was drawn inside each coil's water phantom in a modulus image. The ratio of mean signal intensity for each coil plotted against the shield separation is shown in FIG. 5. The dependence of this ratio is roughly flat from about ½ to about 2 shield diameters. The coil-coil interaction, as thus measured, was 9.8% at 5 cm, a substantial effect.

Artful placement of the coils of the array of FIG. 3 is preferred to displace the concurrently active coils of a given group by at least the equivalent of one hexagonal shield cross dimension. The coils of other inactive groups are thus the nearest neighbors to a coil which may be active in the excitation or readout phase of a pulse sequence, with the possibility of parasitic coupling to the active coil. Thus, there is a remaining degree of coupling between RF cells to be removed or compensated. Further reduction of this effect is may be obtained by processing the received signals to remove or reduce the effect through software, and/or the physical coupling may be reduced or compensated directly.

There are two types of coupling that can occur between different RF cells in the experiment. The first occurs if the coil shielding is inadequate and a coil is sensitive to an object in the volume of another coil. That coupling effect is spatially varying, that is, it varies from pixel to pixel in an image. The second effect is caused by electronic coupling in the system (coil/coil, cable/cable, etc) and can be quantified with a single complex weighting factor between different channels for all pixels. Thus, each pixel in the final image is a linear combination of the pixel value from the coil of interest and aliased pixel values from the other coils weighted by a complex sensitivity factor, S. If $S_{\gamma,\rho}$ is the complex sensitivity at one pixel of RF cell γ to the corresponding aliased pixel in RF cell ρ, then one can construct an $n_{cell} \times n_{cell}$ sensitivity matrix for each pixel in the collected images. Consider the matrix relation $$Sv = a$$

where a is an $n_{cell}$ long vector containing the complex image values the chosen pixel has in the collected images, and v is an $n_{cell}$ long vector listing the separated pixel values for the originally superimposed positions. It is desired to recover v to produce $n_{cell}$ images with the ghosts removed. This is accomplished by measuring $S_{\gamma,\rho}$ experimentally for the system, then by applying $$v = S^{-1} a$$

This known procedure ("SENSE") was developed for the removal of artifact from MR images obtained with a plurality of RF coils arranged about a common subject. See Pruessmann KP, Magnetic Resonance in Medicine, v. 42, 952–62, (1999) for a description of the SENSE procedure.

One physical approach to the further attenuation of undesired coupling is to produce a greater spectral distance between the interfering RF cells by a detuning arrangement. To further this approach in the present invention, the birdcage coil 56 is augmented by one or more detuning conductor(s) 60, each comprising an open loop disposed intermediate the birdcage coil and the shield. This loop is closed electrically by a PIN diode 62 which is activated by application of a DC potential. Upon such activation, previously floating loop 60 now couples to the birdcage coil 56 altering the resonant properties of coil 50. In the present invention, controller 42 selects all RF coils for detuning, other than the coils presently selected for excitation or readout. In this manner, the resonant behaviour of the detuned coils is shifted away from the spectral region of interest.

In an alternative mode of operation, the active coil(s) may be detuned to the desired resonant frequency and the non-active coils remain resonant at their respective quiescent resonant frequency.

Other alternative detuning arrangements are realized through other choices of coupling auxiliary reactances to the RF coil. Another example is Barberi, et al, Mag. Res. In Med., v.43, pp. 248–289 (2000).

Figure 6:
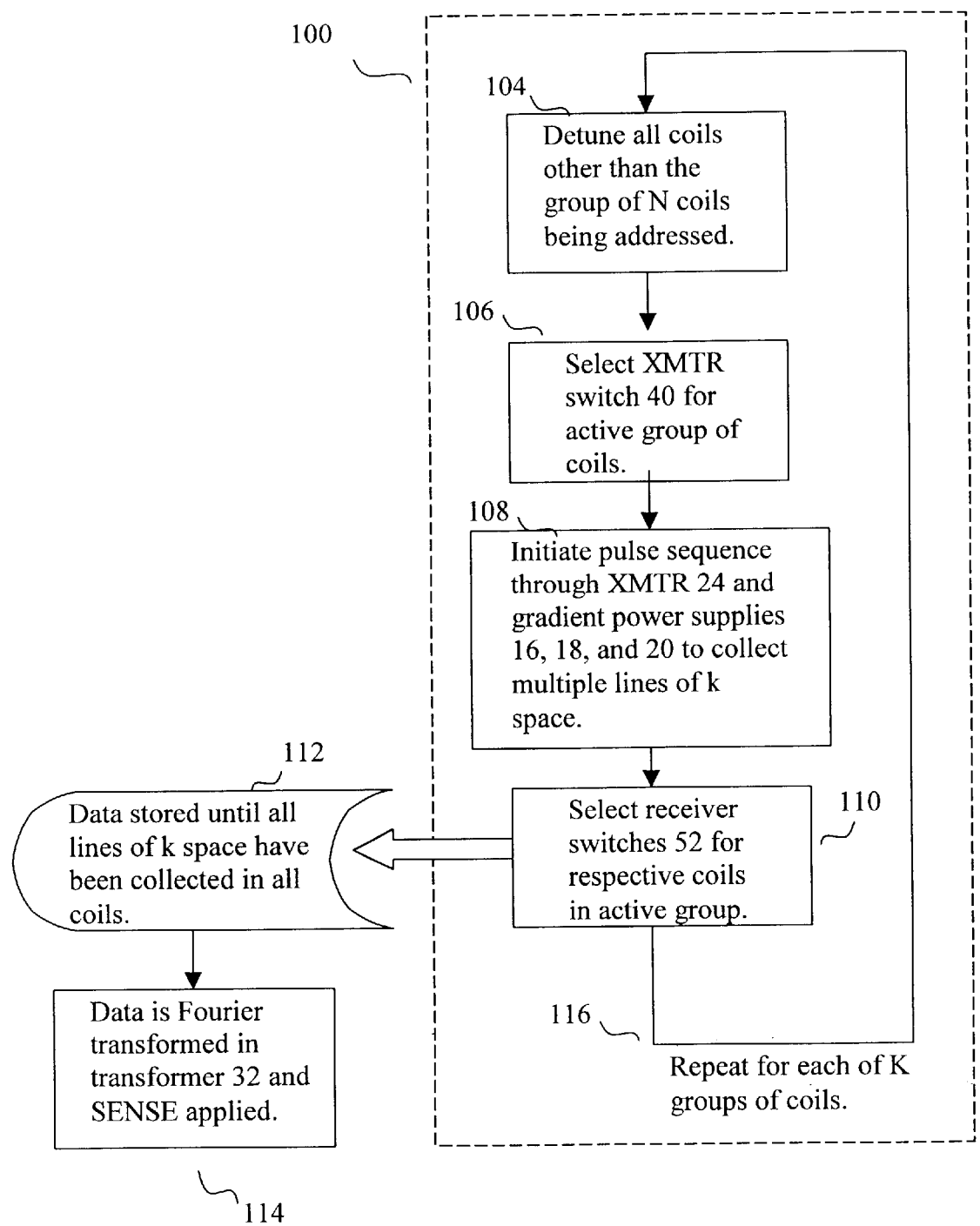
FIG. 6 illustrates a portion of a flow chart procedure for multi-object imaging.

Turning now to FIG. 6, there is shown a general set of operations 100 for execution within controller 42 for operation of the invention. At block 104, the detuning feature is applied to activate the PIN diodes 64 of detuning loops 60 for respective RF cells $48_{x,i}$. Typically, detuning is applied to all coils except the coils within the next sub-array of RF coils to become active. Block 106 then issues the code to instruct high power RF switch 40 to direct RF power to the selected power splitter $44_x$. At block 108, the controller initiates the desired pulse sequence which is applied concurrently to each of the now active coils of the active sub-array. The width, shape, and time incidence of RF pulses is commonly selected through control of modulator 26. In like manner, the magnetic gradients 16,18 and 20 are activated for durations, shapes and magnitudes at the desired time indicia in accord with the prescribed pulse sequence. The controller repeats the pulse sequence to acquire data representing a portion of k-space of prescribed magnitude and location (referenced to k-space origin) for the RF cells comprising the active sub-array. At block 110, the receiver switches 520 are operated by controller 42 to direct the inputs of the receivers $52_{A,B,C,D}$ toward preamplifiers of the respective active array cells. For the purposes of this work, each receiver may be considered provide digitized, phase resolved free induction decay data for storage external to the time critical procedures represented by the activities controlled within block 100. Such storage is available within processor 34 as represented by block 112. Storage is understood to comprehend the proper association of the elemental datums of k-space portions with other such k-space portions to form a complete image within the selected field of view for the corresponding object and thus for each object of the entire N×K array. The data, thus organized is then subject to Fourier transformation from the time domain to obtain, for example, spatial images of the several objects presented within the array.

Further processing of the data, as appropriate, is applied within the context of block 114. For example, the SENSE procedure is useful to remove artifacts imposed by close proximity of RF cells. This information is then available for display and output as desired.

Controller operations within block 100 are executed in nested loops to cycle through all sub-arrays of RF cells (on an interleaved basis to promote the greatest time efficiency) and then in an outer loop to examine the several portions of k-space forming the entire k-space to be measured. The operations within block 100 are intensely time critical, in the sense that demands for time synchrony within the nuclear resonant spin systems are the essence of a pulse sequence. Operations within processor 34 are not constrained by such requirements of synchrony. This division of operations is commonly practiced within modern magnetic resonance apparatus.

In the preferred embodiment, the RF coil array comprises 19 coils arranged in close packed hexagonal form to fit within a bore of 29 cm of a Varian Unity™ imager. The specific example of the preferred embodiment is designed to image 16 objects (mice) at 7 Tesla and the remaining three coils are available for use as spares, if required. For this preferred embodiment, each RF coil is a 16 rung birdcage coil, 3 cm diameter by 10 cm long, resonant at 300 MHz and presenting 50 ohms to the RF source/sink. These coils are constructed in conventional fashion from etched printed circuit boards and ceramic chip capacitors. Each coil is shielded by a 40 $\mu$m wall thickness grounded copper hexagonal cross section tube, 5 cm (cross dimension) by 20 cm in length. Each coil is supported within a plastic hexagonal shell with the shield wrapped on the outside of the shell and the shells arranged in rows of cells, (3cells-4cells-5cells-4cells-3cells) to fit inside the magnet bore of 29 cm. The separation of the outer walls of adjacent shields is negligible, but sufficient to keep the shields mechanically and electrically isolated. The sixteen RF coils are organized into a 4×4 electronic array and their shields are independently grounded.

Figure 7A:
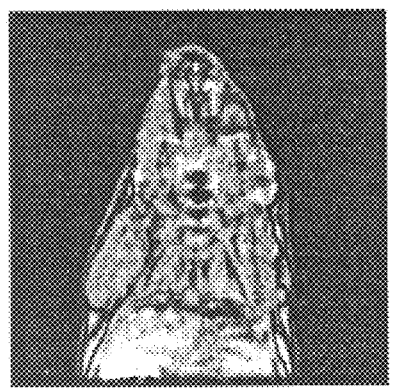
FIG. 7a shows an image of a mouse acquired in one cell with an empty neighboring RF cell.
Figure 7B:
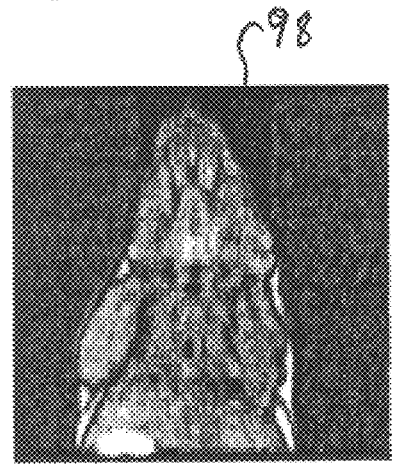
FIG. 7b shows the effect of a simple phantom in an adjacent RF cell
Figure 7C:
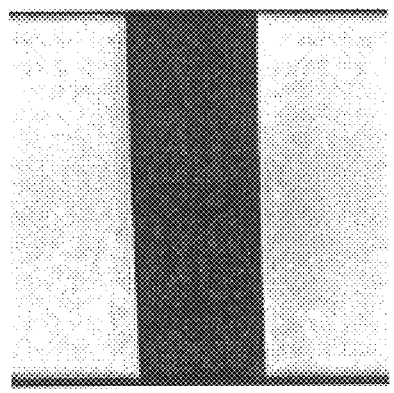
FIG. 7c shows the image of the water phantom.
Figure 7D:
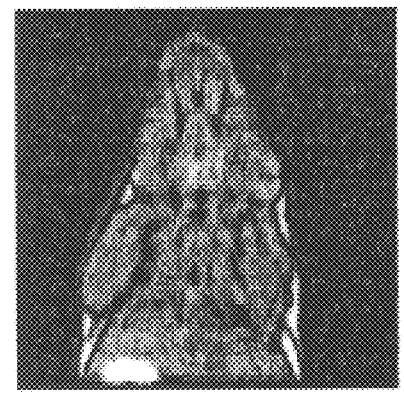
FIG. 7d shows the same image as in FIG. 7b with crosstalk effects removed by post acquisition processing.

The effects upon acquired images for adjacent objects was studied at 1.5 Tesla using the two cell apparatus described above. FIG. 7a shows the image of a mouse acquired in one cell with the adjacent cell empty. A 3D fast spoiled gradient-echo sequence was employed. The sequence employed for FIGS. 7A–D is parameterized by TR/TE=7.9/2.3 (ms) with field of view=4×4×3 (cm) and sampling frequency×phase×phase=128×128×60; NEX=16. Thus one obtains 312 micrometers×312 micrometers×500 micrometer resolution in the volume "slab" selected for data acquisition. Thus, the image of FIG. 7a represents a planar thickness of about 500 $\mu$m selected from the 3 cm thickness of the slab. The shields of the prototype two RF cells are separated by 5 cm. When a phantom tube is inserted into the adjacent cell, FIG. 7b shows the acquired image of the mouse that now contains a ghost 98 of the phantom in the cell adjacent to the mouse. The image of the phantom itself is shown in FIG. 7c. Using postacquisition processing, such as the SENSE procedure, as discussed above, the ghost 98, evident in FIG. 7b is substantially removed to yield the image of FIG. 7d.

Although this invention has been described with reference to particular embodiments and examples, other modifications and variations will occur to those skilled in the art in view of the above teachings. For example, although a specific form of detuning RF coils within an array of RF coils, other physical detuning structures may be employed. The description above contemplates magnetic gradient control either common to all RF cells or incorporation of individual (local) gradient control within respective RF cells. Although birdcage geometry is preferred for specific imaging applications, RF coil geometry is not restricted thereto for practice of the invention. Further, whereas the acquisition of spatial images has been discussed above, the acquisition spectral data from multiple objects for analytical purposes is within the purview of the invention. It should be understood that, within the scope of the appended claims, this invention may be practiced otherwise than as specifically described.

What is claimed is:

1. Apparatus for the concurrent acquisition of images for a corresponding plurality of objects, comprising
    (a) a polarizing magnet for maintaining a uniform magnetic field over a selected volume,
    (b) magnetic gradient module for establishing a magnetic gradient of selected direction and selected magnitude over said sensitive volume,
    (c) a first plurality of K groups of RF cells, K>1, each said group comprising N said cells, each said RF cell defining a subspace of said sensitive volume for containing one of said plurality of objects,
    (d) an RF power source switchable to selected one of said K groups and distributed concurrently to each said plurality of N said cells,
    (e) a plurality of N RF receivers, each said receiver deriving a signal selected from corresponding said cells of said K groups,
        each said RF cell comprising a transmit/receive isolator for isolated communication between said RF source or said corresponding RF receiver and an RF coil,
        a controller providing excitation control signals to said RF power source to direct RF power to said selected group, and providing receiver signal derivation logic to said plurality of N receivers.

2. The apparatus of claim 1 wherein said RF power source comprises a high power RF switch.

3. The apparatus of claim 2 further comprising an RF power divider for distributing RF power to each of said plurality of N cells.

4. The apparatus of claim 1 further comprising an N pole, K throw switch whereby each said N receivers derive said signal selected from corresponding cells of one said K groups.

5. The apparatus of claim 1 further comprising reactance selectably activated for a respective RF coil to detune said RF coil upon activation thereof.

6. The apparatus of claim 5 wherein said controller generates detuning control logic signals for activation of selected said reactances.

7. The apparatus of claim 1 wherein said transmit receive isolator comprises a quadrature hybrid.

8. The apparatus of claim 1 wherein said RF coil comprises a birdcage coil.

9. The apparatus of claim 8 wherein said quadrature hybrid provides quadrature components of said RF power and said birdcage coils is excited in quadrature.

10. The apparatus of claim 1 further comprising an acquired signal processor for processing signals derived from each said N receivers and associating said acquired signals with the respective object.

11. An array of RF coils disposed in mutual proximity, each said coil comprising a resonant frequency, each said coil comprising a corresponding auxiliary impedance, each said auxiliary impedance selectably capable of coupling to said corresponding coil, whereby said selected coupling shifts the resonant frequency of said corresponding coil.

12. The array of claim 11 wherein said auxiliary impedance comprises a switch wherewith said selective capability is implemented.

13. The array of claim 12 wherein said switch comprises a PIN diode.

14. The method of improving the isolation of an array of normally resonant RF coils from one said normally resonant RF coil, comprising providing a respective electrically floating conductor in close proximity to each corresponding RF coil, said conductor having at least two terminals and substantially incapable of supporting a circulating current, for each said RF coils except said one RF coil, activating an electrical connection between said respective terminals whereby each said conductor supports a circulating RF current and said corresponding RF coil is detuned from the normally resonant parameters thereof.

15. The method of improving the isolation of an array of normally resonant RF coils from one said normally resonant RF coil, comprising providing a respective electrically floating conductor in close proximity to each corresponding RF coil, said conductor having at least two terminals and substantially incapable of supporting a circulating current, for said one RF coil, activating an electrical connection whereby said conductor of said supports a circulating RF current between said terminals thereof and said corresponding RF coil is detuned from the normally resonant parameters thereof.

16. The method of concurrently obtaining magnetic resonance images of a plurality of N×K objects within a controllable magnetic field distribution, N>1 and K>1, comprising the steps of (a) associating said objects into K identifiable groups, (b) selecting a $K^{th}$ group of N said objects forming an active group, (c) coupling RF power to each said objects of said active group to effect an excitation portion of a desired magnetic resonance pulse sequence, manipulating said controllable magnetic field in accord with said desired pulse sequence at prescribed values of parameters of said pulse sequence, (d) directing inputs of N RF receivers to corresponding ones of said active group of N objects whereby respective free induction decay signals are acquired, (e) storing said free induction decay signals as data sets identifiable with respective ones of said objects obtained at said prescribed values, (f) repeating steps (c) through (e) for a sufficient variation in values of said parameters to obtain a representation within said free induction decay signals to express a portion of k-space for each said objects of said active group, (g) selecting a different value of K to identify another group as the active group, (h) repeating steps (b) through (g) until all values of K have been selected, whereby representations of the corresponding portions of k-space for all K groups have been obtained, (i) repeating steps (b) through (h) until data sets representative of the entire k-space have been acquired, and (J) processing each said data sets to obtain spatial images of said objects.

17. The method of claim 16 wherein said magnetic resonance pulse sequence comprises a 3 dimensional fast echo sequence.

18. The method of claim 16 wherein said step (g) further comprises removal from each said image of artifact attributable to the presence of others of said N×K−1 objects.

* * * * *